United States Patent
Ryu

(10) Patent No.: US 8,099,656 B2
(45) Date of Patent: Jan. 17, 2012

(54) REED SOLOMON DECODER

(75) Inventor: Tae-Gyu Ryu, Seoul (KR)

(73) Assignee: Core Logic, Inc., Seoul (KR)

( * ) Notice: Subject to any disclaimer, the term of this patent is extended or adjusted under 35 U.S.C. 154(b) by 880 days.

(21) Appl. No.: 12/214,730

(22) Filed: Jun. 20, 2008

(65) Prior Publication Data

US 2008/0320372 A1   Dec. 25, 2008

(30) Foreign Application Priority Data

Jun. 21, 2007  (KR) .......................... 10-2007-0061144

(51) Int. Cl.
*H03M 13/00* (2006.01)

(52) U.S. Cl. ........................................ 714/784; 714/785

(58) Field of Classification Search ................... 375/262; 714/793, 791, 781, 784, 785
See application file for complete search history.

(56) References Cited

U.S. PATENT DOCUMENTS

| | | | |
|---|---|---|---|
| 6,031,875 A * | 2/2000 | Im ................................ | 375/262 |
| 6,694,476 B1 * | 2/2004 | Sridharan et al. ............. | 714/781 |
| 6,928,601 B2 * | 8/2005 | Katayama et al. ............ | 714/781 |
| 7,281,196 B2 * | 10/2007 | Pollock ......................... | 714/784 |
| 2003/0009723 A1 * | 1/2003 | Chien ............................ | 714/784 |

FOREIGN PATENT DOCUMENTS

| KR | 1999-002525 | 1/1999 |
|---|---|---|
| KR | 10-2006-0065452 A | 6/2006 |

* cited by examiner

*Primary Examiner* — David Ton

(74) *Attorney, Agent, or Firm* — The Nath Law Group; Joshua B. Goldberg; Jerald L. Meyer

(57) ABSTRACT

Techniques, systems and computer program products are described for providing a Reed Solomon decoder. The Reed Solomon decoder includes a syndrome polynomial generator to generate syndrome polynomials for subchannel data received from subchannels. In addition, a syndrome polynomial selector selects one of the generated syndrome polynomials according to a preset priority. An error location/error value polynomial generator generates an error location polynomial and an error value polynomial by applying a first algorithm to the selected syndrome polynomial. Also an error location/error value calculator calculates an error location by applying a second algorithm to the error location polynomial and calculates an error value by applying a third algorithm to the error value polynomial. Further, an error corrector corrects an error included in the received subchannel data by applying the calculated error location and the calculated error value to the received subchannel data.

20 Claims, 4 Drawing Sheets

REED SOLOMON DECODER

CLAIM OF PRIORITY

This application claims priority under 35 USC §119(a) to Korean Patent Application No. 10-2007-0061144, filed on Jun. 21, 2007, in the Korean Intellectual Property Office, the entire contents of which are incorporated by reference.

BACKGROUND

The present invention relates to a Reed Solomon decoder for error correction.

A digital communication system includes means to correct a signal error generated due to noise in a channel, e.g., technology using a Reed Solomon code. Because a Reed Solomon code has a high code rate and superior correction capability, it can be used in various applications including a compact disc player, a digital audio tape recorder, a digital video cassette recorder, digital video broadcasting-terrestrial (DVB-T), and digital multimedia broadcasting (DMB).

SUMMARY OF THE INVENTION

Techniques, systems and apparatus are described for providing a Reed Solomon decoder having a simplified structure. By simplifying its structure, a size of the Reed Solomon decoder can be decreased and the processing speed can be improved.

According to an aspect of the present invention, there is provided a Reed Solomon decoder including: a syndrome polynomial generator which generates syndrome polynomials for plural pieces of subchannel data received from a plurality of subchannels; a syndrome polynomial selector which selects one of the syndrome polynomials according to a preset priority; an error location/error value polynomial generator which generates an error location polynomial and an error value polynomial by applying a first algorithm to the selected syndrome polynomial; an error location/error value calculator which calculates an error location by applying a second algorithm to the error location polynomial and calculates an error value by applying a third algorithm to the error value polynomial; and an error corrector which corrects an error included in the received subchannel data by applying the error location and the error value to the received subchannel data.

The first algorithm may be a Euclid algorithm, the second algorithm may be a Chien search algorithm, and the third algorithm is a Forney algorithm.

The syndrome polynomial generator may include subchannel syndrome polynomial generators respectively corresponding to the plurality of subchannels, and the numbers of the error location/error value polynomial generator and the error location/error value calculator may be 1 each.

The Reed Solomon decoder may further include an error location/error value polynomial buffer which temporarily stores the error location polynomial and the error value polynomial.

The Reed Solomon decoder may further include a parallel serial converter which receives error correction data from the error corrector in parallel and outputs the error correction data in series.

A subchannel having the lowest priority from among the plurality of subchannels may be a subchannel for data service.

The Reed Solomon decoder may further include a subchannel buffer for data service which receives the subchannel data, for data service, in series and temporarily stores the subchannel data.

The error location/error value polynomial generator may output a control signal for activating the subchannel buffer for data service after generating the error location polynomial and the error value polynomial.

The subchannel buffer for data service may output the temporarily stored subchannel data for data service to the syndrome polynomial generator in parallel, according to the control signal.

The subchannel buffer for data service may receive the error correction data from the error corrector and outputs the error correction data in a packet.

The received subchannel data may be transmitted in a terrestrial digital multimedia broadcasting (TDMB) method.

According to another aspect of the present invention, there is provided a Reed Solomon decoding method including: generating syndrome polynomials for plural pieces of subchannel data received from a plurality of subchannels; selecting one of the generated syndrome polynomials according to a preset priority; generating an error location polynomial and an error value polynomial by applying a first algorithm to the selected syndrome polynomial; calculating an error location by applying a second algorithm to the error location polynomial and calculating an error value by applying a third algorithm to the error value polynomial; and correcting an error included in the received subchannel data by applying the error location and the error value to the received subchannel data.

The first algorithm may be a Euclid algorithm, the second algorithm may be a Chien search algorithm, and the third algorithm may be a Forney algorithm.

The Reed Solomon decoding method may further include temporality storing the error location polynomial and the error value polynomial.

The Reed Solomon decoding method may further include receiving error correction data from the correcting of an error in parallel and outputting the error correction data in series.

A subchannel having the lowest priority from among the plurality of subchannels may be a subchannel for data service.

The Reed Solomon decoding method may further include receiving the subchannel data for data service in series and temporarily storing the subchannel data for data service.

The generating of an error location polynomial and an error value polynomial may output a control signal for activating the temporarily storing of the subchannel data for data service after generating the error location polynomial and the error value polynomial.

The temporarily storing of the subchannel data for data service may output the temporarily stored subchannel data for data service to the generating of the syndrome polynomials in parallel, according to the control signal.

The temporarily storing of the subchannel data for data service may receive the error correction data from the correcting of an error and outputs the error correction data in a packet.

The received subchannel data may be transmitted in a TDMB method.

According to another aspect of the present invention, there is provided a computer readable recording medium having recorded thereon a program for executing a Reed Solomon decoding method including: generating syndrome polynomials for plural pieces of subchannel data received from a plurality of subchannels; selecting one of the generated syndrome polynomials according to a preset priority; generating an error location polynomial and an error value polynomial by applying a first algorithm to the selected syndrome polynomial; calculating an error location by applying a second algorithm to the error location polynomial and calculating an error value by applying a third algorithm to the error value polynomial; and correcting an error included in the received subchannel data by applying the error location and the error value to the received subchannel data.

BRIEF DESCRIPTION OF THE DRAWINGS

Like reference symbols in the various drawings indicate like elements.

DETAILED DESCRIPTION OF THE INVENTION

Techniques, systems and computer program products are described for a Reed Solomon decoder having a simplified structure. The Reed Solomon decoder is included in a demodulator of terrestrial digital multimedia broadcasting (TDMB).

Encoding and decoding a Reed Solomon code are performed in a Galois field. A Galois field is a finite field that contains only finitely number of elements. Finite fields are important in number theory, algebraic geometry, Galois theory, cryptography, and coding theory, for example. In the Galois field, a Reed Solomon code can be expressed as RS (n, k, t). In this expression, n denotes a length of a reed Solomon codeword, k denotes a length of a message, and t denotes a number of error correctable bytes, which is generally (n−k)/2. For example, when a Reed Solomon code is RS(204, 188, 8), a transmitter adds parity data of 16 bytes to message data of 188 bytes and transmits a Reed Solomon codeword of 204 bytes, and a receiver can correct an error up to 8 bytes from the received Reed Solomon codeword of 204 bytes.

In terrestrial digital multimedia broadcasting (TDMB), a main service channel (MSC) is divided into a plurality of subchannels. A modulator can be used in TDMB to simultaneously process the plurality of subchannels in order to perform new functions, such as simultaneously viewing two video broadcasts on one screen. In addition, TDMB provides video broadcasting, audio broadcasting, and data service.

For Moving Picture Experts Group-2 transport stream (MPEG-2 TS), which is data transmission of video broadcasting, an error generated during transmission is corrected by using a convolution code of digital audio broadcasting (DAB) and the Reed Solomon code described above. Also, in data service, a transmission error is corrected by using the Reed Solomon code in an enhanced packet mode (EPM).

Figure 1:
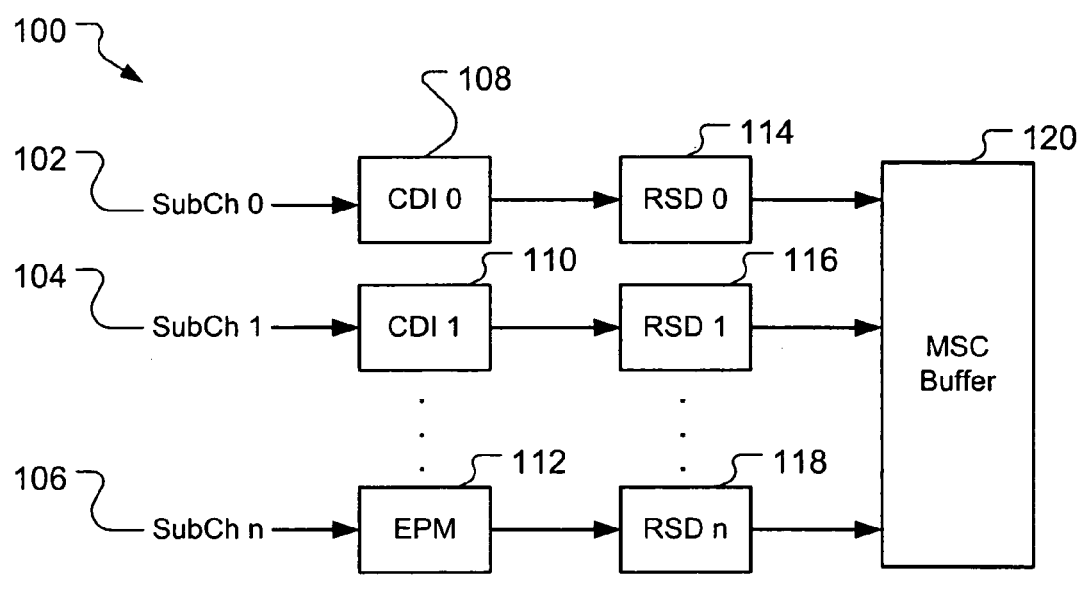
FIG. 1 is a diagram illustrating an example of a conventional Reed Solomon decoder in a number corresponding to a number of subchannels.

FIG. 1 is a block diagram illustrating an example communication system 100 incorporating a conventional Reed Solomon decoder RSD0 108, RSD1 110, . . . RSDn 112 for each subchannel SubCh0 102, SubCh1 104, . . . SubChn 106 of a MSC. Each subchannel SubCh0 102, SubCh1 104, . . . SubChn 106 passes through a corresponding convolution de-interleaver (CDI) CDI0 108, CDI1 110 and CDI2 112 and then through the Reed Solomon decoders RSD0 108, RSD1 110, . . . RSDn 112. In addition, a MSC buffer 120 is communicatively connected to the Reed Solomon decoders RSD0 108, RSD1 110, . . . RSDn 112.

To simultaneously process the multiple subchannels SubCh 0 102, SubCh1 104 through SubChn 106 that require Reed Solomon decoding, separate Reed Solomon decoders RSD0 108, RSD1 110 through RSDn 112 are implemented for corresponding subchannels SubCh0 102, SubCh1 104 through SubChn 106, respectively. In the conventional system 100, as the number of Reed Solomon decoder increases, the size of a decoder also increases.

Figure 2:
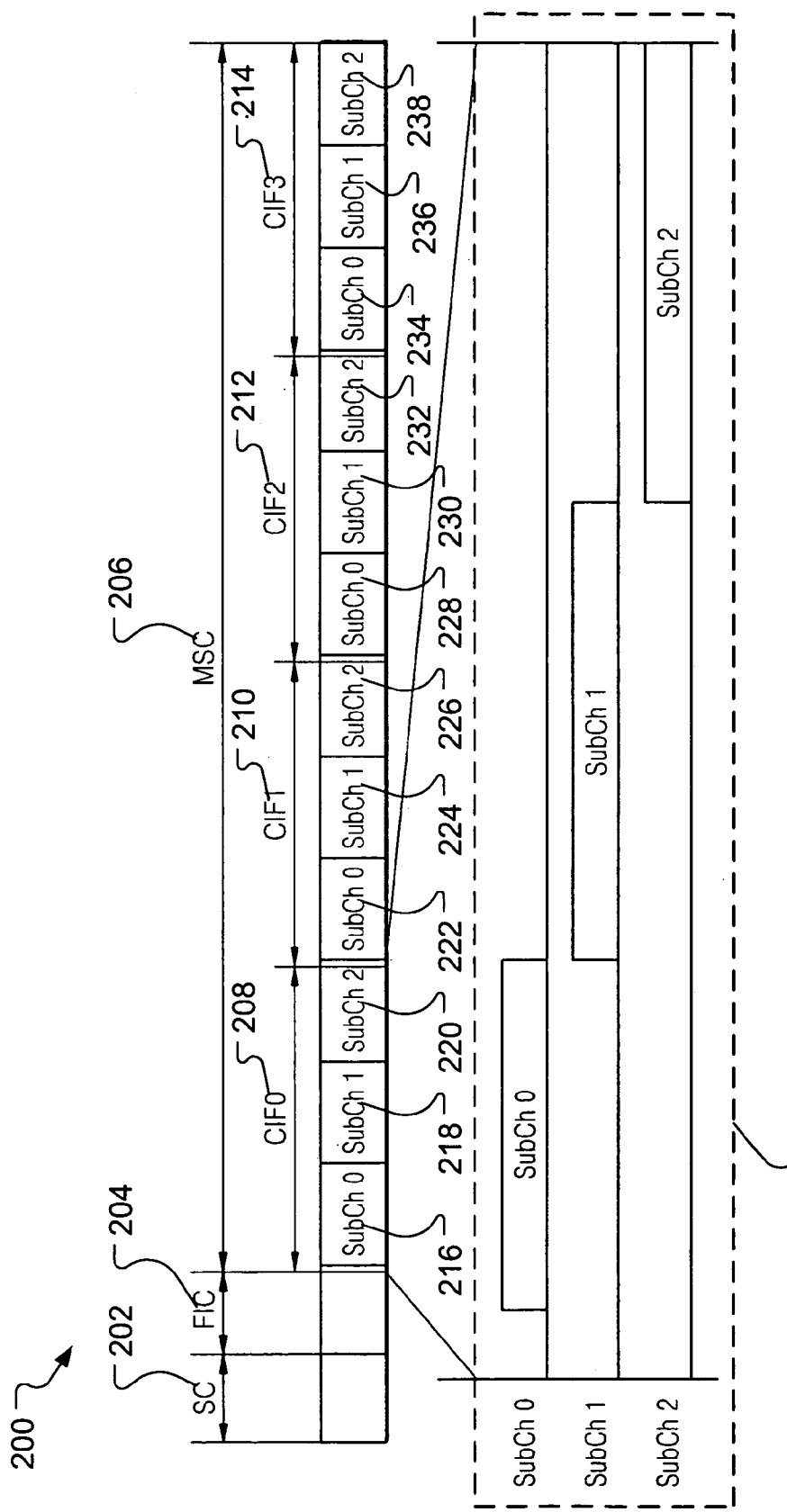
FIG. 2 is a diagram illustrating an example of a transmission frame structure of terrestrial digital multimedia broadcasting (TDMB).

FIG. 2 is a block diagram illustrating an example transmission frame structure 200 for terrestrial digital multimedia broadcasting (TDMB). The transmission frame 200 includes a synchronization channel (SC) 202, a fast information channel (FIC) 204, and a main service channel (MSC) 206.

The SC 202 is used to perform functions of a basic modulator. For example, the SC 202 can be used to perform functions, such as transmission frame synchronization, automatic frequency control, channel state estimation, and transmitter identification The FIC 204 enables a receiver to quickly receive information. Specifically, the FIC 204 is used to transmit multiplex configuration information, selective service information, and data service. In addition, the FIC 204 includes a channel that is not time interleaved and has fixed equal error protection (EEP).

The MSC 206 is a channel for transmitting a service component. The MSC 206 can include various common interleaved frames (CIFs) such as CIF0 208, CIF1 210, CIF2 212 and CIF3 214. In a CIF, a smallest unit for assigning an address is a capacity unit (CU), and the size of one CU is 64 bits. Multiple CUs can be connected together to form one subchannel. The MSC can be implemented as a multi-structure of multiple CIFs 208, 210, 212, 214, with each CIF including multiple subchannels SubCh0 216, 222, 228 or 234; SubCh1 218, 224, 230 or 236; and SubCh2 220, 226, 232 or 238. For example, CIF0 208 includes subchannels SubCh0 216, SubCh1 218 and SubCh2 220. CIF1 210 includes subchannels SubCh0 222, SubCh1 224 and SubCh2 226. CIF2 212 includes subchannels SubCh0 228, SubCh1 230 and SubCh2 232. CIF 3 214 includes subchannels SubCh0 234, SubCh1 236 and SubCH2 238. In addition, FIG. 2 shows an example structure 240 of the subchannels SubCh0 216, SubCh1 218 and SubCh2 220 included in CIF0 210.

In order to transmit a service component of a MSC, two data transmission modes including a stream mode and a packet mode are supported. The stream mode provides transparent transmission in a fixed bit rate by using one subchannel assigned from an information source to a destination. The packet mode transmits several data service components by using one subchannel. Most data services are transmitted by using the MSC. However, some data services such as system information (SI) may not be transmitted using the MSC.

Figure 3:
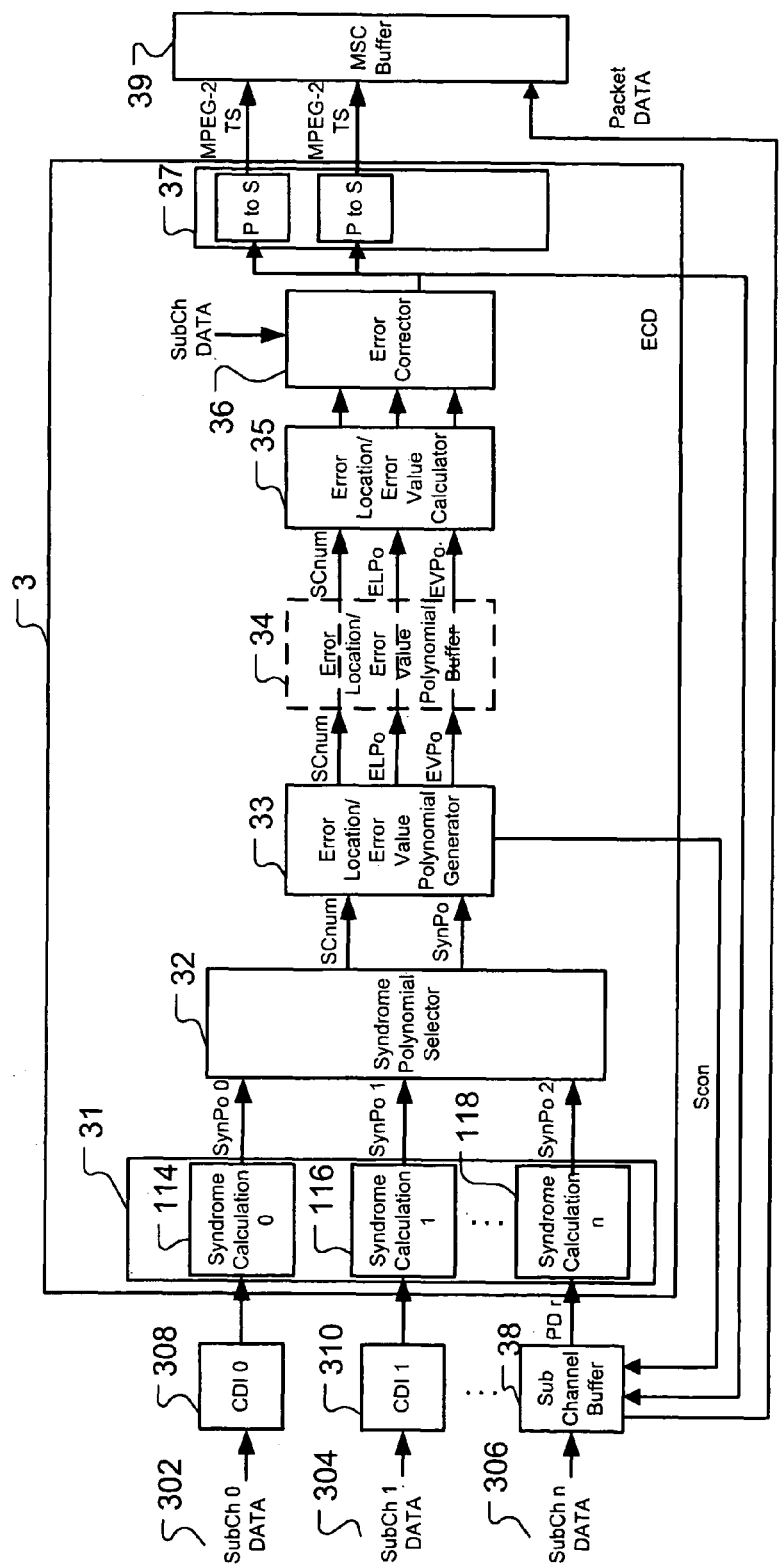
FIG. 3 is a diagram illustrating an example of a Reed Solomon decoder.

FIG. 3 is a diagram illustrating an example of a Reed Solomon decoder 3. The Reed Solomon decoder 3 includes a syndrome polynomial generator 31, a syndrome polynomial selector 32, an error location/error value polynomial generator 33, an error location/error value calculator 35, and an error corrector 36.

Subchannel data 302, 304 and 306 are received from each subchannel SubCh0, SubCh1 and SubCh2 and flow through CDI0 308, CDI1 310 and subchannel buffer 38. The syndrome polynomial generator 31 receives the subchannel data 302, 304 and 306 and generates syndrome polynomials for the received pieces of subchannel data 302, 304 and 306.

Operations of the syndrome polynomial generator 31 are described with reference to FIGS. 2 and 3. The MSC 206 includes multiple CIFs 208, 210, 212, 214, for example. In the example shown in FIG. 2, the MSC 206 is formed using 4 CIFs, e.g., CIF0 208, CIF1 210, CIF2 212 and CIF3 214. Each CIF includes multiple subchannels Subch0 216, 222, 228 or 234; Subch1 218, 224, 230 or 236; and Subch2 220, 226, 232 or 238 sequentially arranged according to information of the FIC 204.

Referring back to FIG. 3, each piece of the subchannel data Subch0 DATA 302, Subch1 DATA 304 through Subchn DATA 306 is sequentially outputted in series after passing through a convolution de-interleaver (CDI) CDI0 308 and CDI1 310 inside a TDMB demodulator. Thus, during a TDMB demodulation process, each piece of the subchannel data Subch0 DATA 302, Subch1 DATA 304 through Subchn DATA 306 is divided according to time and then outputted.

The syndrome polynomial generator 31 generates a syndrome polynomial for each corresponding subchannel data. For example, the syndrome polynomial generator 31 generates syndrome polynomials SynPo0, SynPo1 through SynPon for the corresponding subchannel data Subch0 DATA 302, Subch1 DATA 304 through Subchn DATA 306 respectively by calculating a coefficient of a syndrome polynomial for each piece of the received subchannel data Subch0 DATA 302, Subch1 DATA 304 through Subchn DATA 306. In some implementations, the syndrome polynomial generator 31 includes individual or separate subchannel syndrome polynomial generators: syndrome calculation 0 114, syndrome calculation 1 116 through syndrome calculation n 118. Each of the subchannel syndrome polynomial generators 114, 116, 118 calculates a syndrome polynomial for a corresponding subchannel.

The syndrome polynomial selector 32 selects one syndrome polynomial SynPo from among the syndrome polynomials SynPo0, SynPo1 through SynPon according to a predetermined priority. For example, the priority may be determined based on importance of the data, size of the data or type of data. In particular, the syndrome polynomial selector 32 receives from the syndrome polynomial generator 31 the syndrome polynomials SynPo0, SynPo1 through SynPon corresponding to the subchannel data Subch0 DATA 302, Subch1 DATA 304 through Subchn DATA 306 respectively.

The syndrome polynomial selector 32 temporarily stores the received syndrome polynomials SynPo0, SynPo1 through SynPon. Also, the syndrome polynomial selector 32 outputs a number SCnum of a subchannel corresponding to the selected syndrome polynomial by referring to a memory storing a predetermined priority.

The highest priority may be assigned to subchannels SubCh0 and SubCh1 for video broadcasting and the subchannel(s) that need to be processed within a predetermined time. The lowest priority may be assigned to a subchannel SubChn for transmitting data service and for the subchannel(s) where accuracy is of great importance. The syndrome polynomial selector 32 can select both the syndrome polynomial and the subchannel corresponding to the syndrome polynomial, and the SCnum represents the number of the subchannel.

Also, the Reed Solomon decoder 3 may further include a subchannel buffer 38 that receives the subchannel data SubChn DATA 306 in series and temporarily stores the received subchannel data SubChn DATA 306 for data service. The subchannel data SubChn DATA 306 for data service uses a Reed Solomon code in an enhanced packet mode (EPM).

The error location/error value polynomial generator 33 generates an error location polynomial (ELPo) and an error value polynomial (EVPo) by applying a Euclid algorithm to the selected syndrome polynomial (SynPo). The error location/error value polynomial generator 33 receives the number SCnum of the subchannel corresponding to the selected syndrome polynomial and the SynPo corresponding to the selected subchannel, from the syndrome polynomial selector 32. The error location/error value polynomial generator 33 generates the ELPo and the EVPo corresponding to the selected SynPo by applying the Euclid algorithm to the selected SynPo.

Considering an operation speed of the error location/error value calculator 35, an error location/error value polynomial buffer 34 may be included between the error location/error value polynomial generator 33 and the error location/error value calculator 35. The error location/error value polynomial buffer 34 temporarily stores the error location polynomial ELPo and the error value polynomial EVPo. Also, the error location/error value polynomial generator 33 may output a control signal Scon for activating the subchannel SubChn for data service after generating the ELPo and EVPo.

The subchannel buffer 38 for data service may output the subchannel data SubChn DATA 306 for data service, which is received and temporarily stored in series, to the syndrome polynomial generator 31 in parallel in response to the control signal Scon of the error location/error value polynomial generator 33. Also, the subchannel buffer 38 for data service may output error correction data (ECD) received from the error corrector 36 in a packet.

The error location/error value calculator 35 calculates an error location by applying a Chien search algorithm to the ELPo. In addition, the error location/error value calculator 35 calculates an error value by applying a Forney algorithm to the EVPo.

The error corrector 36 corrects an error included in the received subchannel data SubCh DATA 302, 304, 306 by applying the error location and the error value to the subchannel data SubCh DATA 302, 304, and 306. In particular, the error corrector 36 receives from the error location/error value-calculator 35 the error value corresponding to the error location. In addition, the error corrector 36 receives the subchannel data SubCh DATA 302, 304, 306 having an error from a first in first out (FIFO) memory unit (not shown), and performs an exclusive OR operation on the error value and the subchannel data SubCh DATA to correct the error included in the subchannel data SubCh DATA 302, 304, 306.

The error corrector 36 outputs the ECD in parallel. In some implementations, the Reed Solomon decoder 3 may further include a parallel-serial converter 37 which receives the ECD from the error corrector 36 in parallel and outputs the ECD in series.

In the example shown in FIGS. 2-3, the operations of the Reed Solomon decoder 3 is described for when the subchannel data is Reed Solomon packet data of 204 bytes. As described above, the Reed Solomon decoder 3 includes the syndrome polynomial generator 31, the FIFO memory unit, the error location/error value polynomial generator 33, the error location/error value calculator 35, and the error corrector 36. The syndrome polynomial generator 31 generates a SynPo by receiving the Reed Solomon packet data of 204 bytes. The error location/error value polynomial generator 33 obtains an ELPo and an EVPo from the received syndrome polynomial SynPo. The error location/error value calculator 35 obtains an error value of a corresponding error location by using the error location polynomial ELPo and the error value polynomial EVPo. The error corrector 36 corrects an error of transmission data stored in the FIFO memory unit based on the error value of the corresponding error location.

The syndrome polynomial generator 31 and the FIFO memory unit receive data in a unit of 204 bytes. Because the size of a subchannel inside a CIF is not accurately divided into the unit of 204 bytes, the syndrome polynomial generator 31 and the FIFO memory unit are independently operated according to each subchannel to be processed. The error location/error value polynomial generator 33, the error location/error value calculator 35, and the error corrector 36 are time-divisionally shared.

The syndrome polynomial generator 31, which operates according to each subchannel, transmits the generated syndrome polynomials to the syndrome polynomial selector 32. The syndrome polynomial selector 32 stores the received syndrome polynomials according to their respective subchannels, and transmits a number SCnum of a subchannel processed according to a present priority and a syndrome polynomial SynPo to the error location/error value polynomial generator 33. The highest priority is assigned to video broadcasting that is required to be processed within a predetermined time and the lowest priority is given to data service.

The subchannels can be shared in the Reed Solomon decoder 3 due to the structure of the MSC. Because the subchannels SubCh0 216, 222, 228 or 234; SubCh1 218, 224, 230 or 236; and SubCh2 220, 226, 232 or 238 sequentially exist in the MSC, even when the subchannels SubCh0 216, 222, 228 or 234; SubCh1 218, 224, 230 or 236; and SubCh2 220, 226, 232 or 238 are shared in the Reed Solomon decoder 3, the maximum number of subchannels that can request a Reed Solomon decoding process at the same time is 2.

Also, because the subchannel data is received in series, the number of minimum clocks used for receiving Reed Solomon packet data of 204 bytes is 1632 (204×8) CLK. The number of clocks used by the error location/error value polynomial generator 33 is 313 CLK. Further, the number of clocks used for outputting error corrected data by the error location/error value calculator 35 and the error corrector 36 is 415 CLK.

Because the number of subchannels that can simultaneously request a Reed Solomon decoding process is 2, the number of clocks required for the Reed Solomon decoding process, excluding the number of clocks used for the generation of syndrome polynomials of data of the two subchannels, is 2×(313+415)=1456 CLK. This number is smaller than 1632 CLK, which is the number of clocks used for transmitting the Reed Solomon packet data of 204 bytes of one subchannel to a Reed Solomon decoder. Accordingly, the Reed Solomon decoding process for the subchannels is possible only by using a priority.

Data about the error location polynomial ELPo and the error value polynomial EVPo outputted from the error location/error value polynomial generator 33 is stored with the number SCnum of the subchannel that is being processed in the error location/error value polynomial buffer 34. Because the error location/error value calculator 35 and the error corrector 36 use a greater number of clocks than the error location/error value polynomial generator 33, even if the operation of the error location/error value polynomial generator 33 is completed, the processing of previously received data may not be completed yet. Accordingly, by including the error location/error value polynomial buffer 34, the error location/error value polynomial generator 33 can promptly process an awaiting syndrome polynomial of another subchannel.

The error correction data ECD is transmitted to the main service channel buffer 39 in series after passing through the parallel serial converter 37. The subchannel data SubChn DATA 306 for data service uses a different process as compared to data of other subchannels. In the case of the subchannel data SubChn DATA 306 for data service, pieces of the Reed Solomon packet data of 204 bytes received in series are pre-stored in an internal memory. Accordingly, the subchannel data SubChn DATA 306 for data service is received in parallel by 1 byte, unlike the data of other subchannels. Because the subchannel data SubChn DATA for data service is received in parallel, the number of clocks used for receiving one piece of Reed Solomon packet data is 204 CLK, which provides insufficient time for the Reed Solomon decoding process. Accordingly, the Reed Solomon decoding process on the subchannel data SubChn DATA 306 for data service is controlled by the error location/error value polynomial generator 33 inside the Reed Solomon decoder 3.

After one error location/error value polynomial generation process is completed, the error location/error value polynomial generator 33 commands the subchannel buffer 38 for data service to transmit the next 204 bytes. Because the number of clocks used for calculating the error location and the error value is 415 CLK and the number of clocks used for receiving the Reed Solomon packet data of 204 bytes and generating the error location/error value polynomials is 204+313=515 CLK, the Reed Solomon decoding process can be performed without much or any problem. Also, because the error location/error value polynomial generator 33 directly informs the subchannel buffer 38 for data service that data can be processed, the subchannel buffer 38 for data service does not need to wait for data to be processed, and thus a delay time can be minimized.

As described above, a simplified Reed Solomon decoder can be realized, and thus the size of a TDMB demodulator can be reduced. Although the syndrome polynomial generator 31 is not shared, the syndrome polynomial generator 31 does not occupy a large space in the Reed Solomon decoder 3. The syndrome polynomial generator 31 includes approximately 4,000 gates, but the error location/error value polynomial generator 33 includes approximately 25,000 gates and the error location/error value calculator 35 includes approximately 5,000 gates. Accordingly, when the number of subchannels is 3, the size of the Reed Solomon decoder 3 according to the current embodiment of the present invention is 60% of the size of a conventional Reed Solomon decoder. According to the Reed Solomon decoder 3, the speed of the Reed Solomon decoding process can be reduced by minimizing the delay time.

Figure 4:
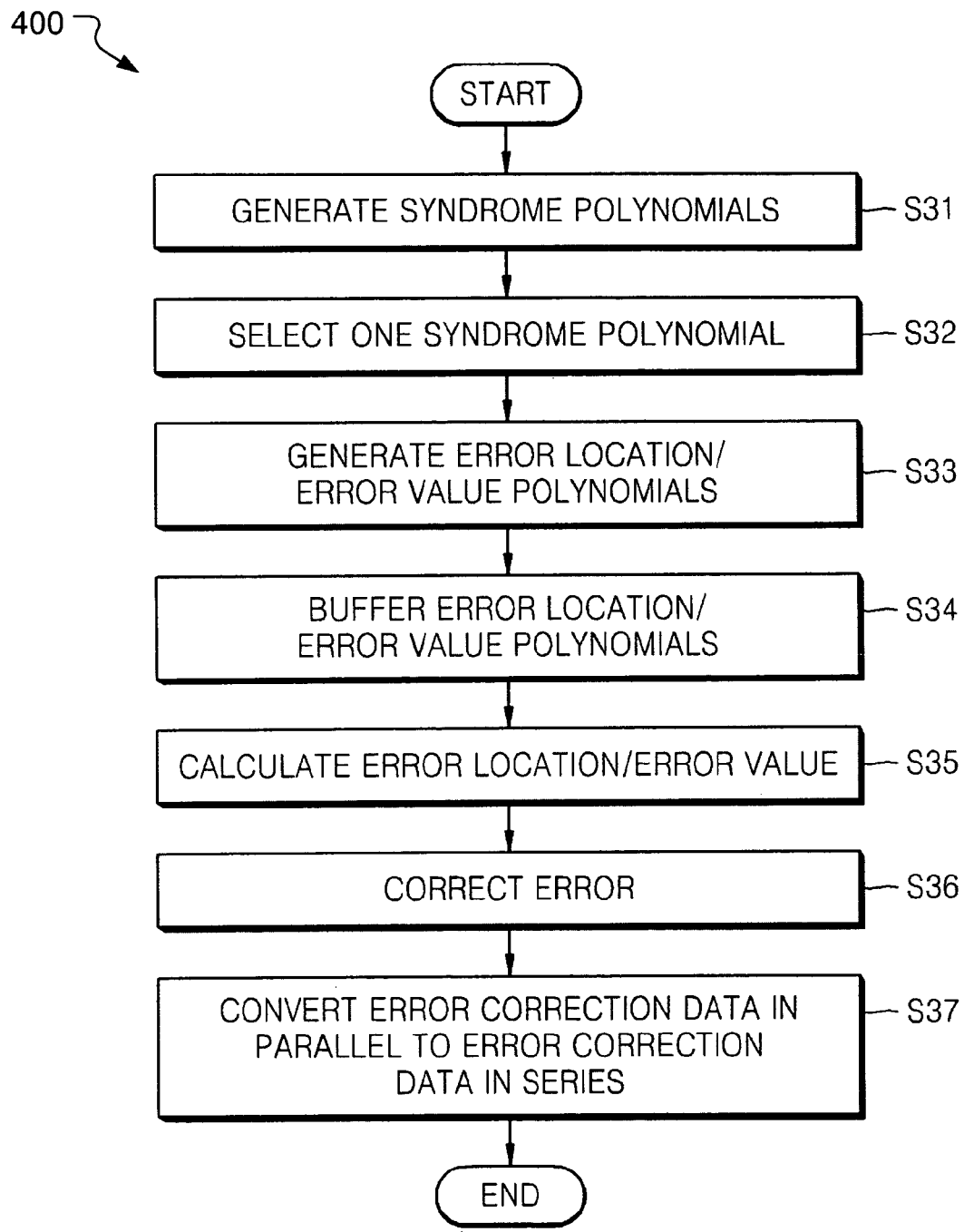
FIG. 4 is a flowchart illustrating an example process for performing Reed Solomon decoding.

FIG. 4 is a flowchart illustrating an example of a Reed Solomon decoding process 400. Syndrome polynomial generation (operation S31) includes calculation of syndrome polynomials for multiple pieces of received subchannel data. Syndrome polynomial selection (operation S32) includes selection of one of the syndrome polynomials according to a preset priority. Error location/error value polynomial generation (operation S33) includes generation of an error location polynomial and an error value polynomial by applying a Euclid algorithm to the selected syndrome polynomial. Error location/error value polynomial buffering (operation S34) includes temporarily storing the error location polynomial and the error value polynomial. Error location/error value operation (operation S35) includes calculation of an error location by applying a Chien search algorithm to the error location polynomial and calculation of an error value by applying a Forney algorithm to the error value polynomial. Error correction (operation S36) includes correction of an error included in the received subchannel data by applying the error location and the error value. Parallel-to-serial conversion (operation S37) includes receiving error correction data in parallel and outputting the error correction data in series.

As described above, the processing time of one Reed Solomon decoder is divided in order to process multiple pieces of subchannel data. Thus, the size of the Reed Solomon decoder can be reduced as compared to a conventional Reed Solomon decoder. Also, the processing speed of the Reed Solomon decoder can be improved as compared to a conventional Reed Solomon decoder.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few implementations and examples are described and other implementations, enhancements and variations can be made based on what is described and illustrated in this application.

What is claimed is:

1. A Reed Solomon decoder comprising:
    a syndrome polynomial generator to generate syndrome polynomials based on subchannel data received from a plurality of subchannels;
    a syndrome polynomial selector to select one of the generated syndrome polynomials according to a preset priority;
    an error location/error value polynomial generator to generate an error location polynomial and an error value polynomial by applying a first algorithm to the selected syndrome polynomial;
    an error location/error value calculator to calculate an error location by applying a second algorithm to the generated error location polynomial and calculate an error value by applying a third algorithm to the generated error value polynomial; and
    an error corrector to correct an error included in the received subchannel data by applying the calculated error location and the calculated error value to the received subchannel data.

2. The Reed Solomon decoder of claim 1, wherein the first algorithm comprises a Euclid algorithm, the second algorithm comprises a Chien search algorithm, and the third algorithm comprises a Forney algorithm.

3. The Reed Solomon decoder of claim 1, wherein the syndrome polynomial generator comprises separate subchannel syndrome polynomial generators corresponding to the plurality of subchannels respectively;

the error location/error value polynomial generator comprises one error location/error value polynomial generator; and the error location/error value calculator comprises one error location/error value calculator.

4. The Reed Solomon decoder of claim 1, further comprising an error location/error value polynomial buffer to temporarily store the error location polynomial and the error value polynomial.

5. The Reed Solomon decoder of claim 1, further comprising a parallel-to-serial converter to receive error correction data from the error corrector in parallel and output the received error correction data in series.

6. The Reed Solomon decoder of claim 1, wherein the syndrome polynomial selector is configured to select one of the generated syndrome polynomials corresponding to subchannels having different priorities with a subchannel having the lowest priority from among the subchannels is for data service.

7. The Reed Solomon decoder of claim 6, further comprising a subchannel buffer for data service to receive the subchannel data in series and temporarily store the received subchannel data.

8. The Reed Solomon decoder of claim 7, wherein the error location/error value polynomial generator outputs a control signal for activating the subchannel buffer for data service after generating the error location polynomial and the error value polynomial.

9. The Reed Solomon decoder of claim 8, wherein the subchannel buffer for data service outputs the temporarily stored subchannel data for data service to the syndrome polynomial generator in parallel, according to the control signal.

10. The Reed Solomon decoder of claim 9, wherein the subchannel buffer for data service receives the error correction data from the error corrector and outputs the error correction data in a packet.

11. A computer implemented method for Reed Solomon decoding comprising:
generating syndrome polynomials for subchannel data received from a plurality of subchannels;
selecting one of the generated syndrome polynomials according to a preset priority;
generating an error location polynomial and an error value polynomial by applying a first algorithm to the selected syndrome polynomial;
calculating an error location by applying a second algorithm to the generated error location polynomial and calculating an error value by applying a third algorithm to the generated error value polynomial; and
correcting an error included in the received subchannel data by applying the calculated error location and the calculated error value to the received subchannel data.

12. The computer implemented method of claim 11, wherein applying the first algorithm comprises applying a Euclid algorithm, applying the second algorithm comprises applying a Chien search algorithm, and applying the third algorithm comprises applying a Forney algorithm.

13. The computer implemented method of claim 11, further comprising temporality storing the error location polynomial and the error value polynomial.

14. The computer implemented method of claim 11, further comprising receiving in parallel error correction data from the correcting of an error and outputting the received error correction data in series.

15. The computer implemented method of claim 11, wherein a subchannel having the lowest priority from among the plurality of subchannels is a subchannel for data service.

16. The computer implemented method of claim 15, further comprising receiving the subchannel data for data service in series and temporarily storing the subchannel data for data service.

17. The computer implemented method of claim 16, further comprising outputting a control signal for activating the temporarily storing of the subchannel data for data service after generating the error location polynomial and the error value polynomial.

18. The computer implemented method of claim 17, further comprising outputting the temporarily stored subchannel data for data service to be used in generating the syndrome polynomials in parallel, according to the control signal.

19. The computer implemented method of claim 18, further comprising receiving the error correction data based on the error correcting and outputting the received error correction data in a packet.

20. A computer program product, embodied on a computer readable medium, operable to cause a data processing apparatus to perform Reed Solomon decoding comprising:
generating syndrome polynomials for subchannel data received from a plurality of subchannels;
selecting one of the generated syndrome polynomials according to a preset priority;
generating an error location polynomial and an error value polynomial by applying a first algorithm to the selected syndrome polynomial;
calculating an error location by applying a second algorithm to the generated error location polynomial and calculating an error value by applying a third algorithm to the generated error value polynomial; and
correcting an error included in the received subchannel data by applying the calculated error location and the calculated error value to the received subchannel data.

* * * * *